United States Patent
Cohen et al.

(10) Patent No.: US 8,361,853 B2
(45) Date of Patent: Jan. 29, 2013

(54) GRAPHENE NANORIBBONS, METHOD OF FABRICATION AND THEIR USE IN ELECTRONIC DEVICES

(75) Inventors: Guy Cohen, Mohegan Lake, NY (US); Christos D. Dimitrakopoulos, Baldwin Place, NY (US); Alfred Grill, White Plains, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 12/902,620

(22) Filed: Oct. 12, 2010

(65) Prior Publication Data
US 2012/0085991 A1    Apr. 12, 2012

(51) Int. Cl.
*H01L 29/06* (2006.01)
*H01L 21/336* (2006.01)

(52) U.S. Cl. ......... 438/198; 438/142; 438/299; 257/28; 977/848; 977/882; 977/888; 977/890; 977/936; 331/74; 216/41; 216/62

(58) Field of Classification Search ............... 438/142, 438/198, 299; 257/28; 977/848, 882, 888, 977/890, 936; 331/74; 343/880; 216/41, 216/62
See application file for complete search history.

(56) References Cited

U.S. PATENT DOCUMENTS

| | | | |
|---|---|---|---|
| 6,413,802 B1 | 7/2002 | Hu et al. | |
| 8,076,204 B2 * | 12/2011 | Anderson et al. | 438/283 |
| 8,106,383 B2 * | 1/2012 | Jenkins et al. | 257/29 |
| 2005/0263795 A1 | 12/2005 | Choi et al. | |
| 2011/0079829 A1 | 4/2011 | Lai et al. | |

OTHER PUBLICATIONS

First, P. N., et al., "Epitaxial Graphenes on Silicon Carbide", MRS Bulletin, Apr. 2010, 35, entire document especially Abstract, pp. 296-305.
International Search Report and Written Opinion dated Aug. 31, 2012 received in a related foreign application.

* cited by examiner

*Primary Examiner* — Long Tran
(74) *Attorney, Agent, or Firm* — Scully, Scott, Murphy & Presser, P.C.; Louis J. Percello, Esq.

(57) ABSTRACT

The present disclosure provides a semiconductor structure including a nanoribbon-containing layer of alternating graphene nanoribbons separated by alternating insulating ribbons. The alternating graphene nanoribbons are parallel to a surface of an underlying substrate and, in some embodiments, might be oriented along crystallographic directions of the substrate. The alternating insulating ribbons may comprise hydrogenated graphene, i.e., graphane, fluorinated graphene, or fluorographene. The semiconductor structure mentioned above can be formed by selectively converting portions of an initial graphene layer into alternating insulating ribbons, while the non-converted portions of the initial graphene form the alternating graphene nanoribbons. Semiconductor devices such as, for example, field effect transistors, can be formed atop the semiconductor structure provided in the present disclosure.

21 Claims, 6 Drawing Sheets

GRAPHENE NANORIBBONS, METHOD OF FABRICATION AND THEIR USE IN ELECTRONIC DEVICES

This invention was made with Government Support under Contract No: FA8650-08-C7838 awarded by Defense Advanced Research Projects Agency (DARPA). The Government thus may have certain rights to this invention.

BACKGROUND

The present application relates to a semiconductor structure, a semiconductor device including said semiconductor structure and methods of fabricating the same. More particularly, the present application relates to a semiconductor structure including a nanoribbon-containing layer of alternating graphene nanoribbons separated by alternating insulating ribbons located atop a substrate and a method of fabricating such a structure. The present application also relates to a semiconductor device, such as a field effect transistor, that includes the semiconductor structure described above.

Several trends presently exist in the semiconductor and electronics industry including, for example, devices are being fabricated that are smaller, faster and require less power than the previous generations of devices. One reason for these trends is that personal devices such as, for example, cellular phones and personal computing devices, are being fabricated that are smaller and more portable. In addition to being smaller and more portable, personal devices also require increased memory, more computational power and speed. In view of these ongoing trends, there is an increased demand in the industry for smaller and faster transistors used to provide the core functionality of the integrated circuits used in these devices.

Accordingly, in the semiconductor industry there is a continuing trend toward fabricating integrated circuits (ICs) with higher densities. To achieve higher densities, there has been, and continues to be, efforts toward down scaling the dimensions of the devices on semiconductor wafers generally produced from bulk silicon. These trends are pushing the current technology to its limits. In order to accomplish these trends, high densities, smaller feature sizes, smaller separations between features, and more precise feature shapes are required in integrated circuits (ICs).

Significant resources go into down scaling the dimensions of devices and increasing packing densities. For example, significant time may be required to design such down scaled transistors. Moreover, the equipment necessary to produce such devices may be expensive and/or processes related to producing such devices may have to be tightly controlled and/or be operated under specific conditions. Accordingly, there are significant costs associated with exercising quality control over semiconductor fabrication.

In view of the above, the semiconductor industry is pursuing graphene to achieve some of the aforementioned goals. Graphene, which is essentially a flat sheet of carbon atoms, is a promising material for radio frequency (RF) transistors and other electronic transistors. Typical RF transistors are made from silicon or more expensive semiconductors such as, for example, indium phosphide (InP). The measured mobility of electrons in graphene was found to be as high as 200,000 $cm^2V^{-1}s^{-1}$, while it is only about 5400 $cm^2V^{-1}s^{-1}$ for InP and about 1400 $cm^2V^{-1}s^{-1}$ for silicon.

With all its excellent electronic properties, graphene is missing a bandgap, making it unsuitable for fabrication of digital devices. Transistors fabricated using graphene in the channel would have $I_{on}/I_{off}$ ratios of the order of 10 or less, with many more orders of magnitude still required for proper function of such devices. It has been shown that bandgaps can be created in graphene if fabricated in the form of nanoribbons. The size of the bandgap increases with decreasing width of the nanoribbon and for potential practical application the width of the graphene nanoribbons (GNR) has to be less than 10 nm, preferably less than 5 nm.

Fabrication of GNR has been demonstrated before on exfoliated graphene nanoflakes. The prior art for fabrication of GNR is based on patterning and etching, usually by RIE, of the graphene layer. Such techniques form nanoribbons with non-uniform and potentially damaged edges, forming line edge roughness, LER, which deteriorates the electrical quality of the GNR.

SUMMARY

The present disclosure provides a semiconductor structure including a nanoribbon-containing layer of alternating graphene nanoribbons separated by alternating insulating ribbons. The graphene nanoribbons of the present disclosure possess semiconductive properties and may be a technological alternative to silicon semiconductors. The alternating graphene nanoribbons are parallel to a surface of an underlying substrate and, in some embodiments, they might be oriented along crystallographic directions of the substrate. The alternating insulating ribbons may comprise fully hydrogenated graphene, i.e., graphane, partially hydrogenated graphene, fluorinated graphene or fluorographene. The semiconductor structure mentioned above can be formed by selectively converting portions of an initial graphene layer into alternating insulating ribbons, while the non-converted portions of the initial graphene layer form the alternating graphene nanoribbons. Semiconductor devices such as, for example, field effect transistors, can be formed atop the semiconductor structure provided in the present disclosure.

One aspect of the present disclosure relates to a semiconductor structure that includes a substrate, and a nanoribbon-containing layer located on an upper surface of the substrate. The nanoribbon-containing layer includes alternating graphene nanoribbons that are separated by alternating insulating ribbons. In some embodiments, the alternating insulating ribbons can also be nanoribbons.

Another aspect of the present disclosure relates to a method of fabricating such a semiconductor structure. The method includes providing a graphene layer located on an upper surface of a substrate. Alternating portions of the graphene layer are then converted into insulating ribbons, while remaining alternating portions of the graphene layer form graphene nanoribbons. The converting process can include exposing alternating portions of the graphene layer to a hydrogen-containing ambient or a fluorine-containing ambient. In one embodiment, the alternating portions of the graphene layer that are converted into insulating ribbons can be exposed portions of the graphene layer that are not protected by a patterned hard mask. In another embodiment, the alternating portions of the graphene layer that are converted into insulating ribbons can be exposed portions of the graphene layer that are not protected by a spacer; the spacer has a pillar shape and extends vertically upward from a surface of the graphene layer.

A further aspect of the present disclosure relates to a semiconductor structure including at least one semiconductor device located atop a substrate, wherein the at least one semiconductor devices includes at least one graphene nanoribbon as a device element, and the at least one graphene nanoribbon is a component of a nanoribbon-containing layer comprising alternating graphene nanoribbons separated by alternating insulating ribbons.

In one example, the semiconductor structure includes a substrate, and a nanoribbon-containing layer located on an upper surface of the substrate. The nanoribbon-containing layer includes alternating graphene nanoribbons that are separated by alternating insulating ribbons. The device further includes a gate dielectric layer located atop the nanoribbon-containing layer, and a gate conductor located on a portion of the gate dielectric layer. The device further includes a source region and a drain region positioned on opposite sides of the gate conductor. In one embodiment, the source region and the drain region contact an upper surface of the nanoribbon-containing layer by extending through the gate dielectric layer. In another embodiment, the source region and the drain region contact an upper surface of the nanoribbon-containing layer and a portion of the gate dielectric layer is located on sidewalls and an upper surface of both the source region and the drain region.

DETAILED DESCRIPTION

The present invention, which provides a semiconductor structure including a nanoribbon-containing layer of alternating graphene nanoribbons separated by alternating insulating ribbons located atop a substrate, a semiconductor device including such a structure and methods of fabricating such a structure, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments of the present application will now be described in greater detail by referring to the following discussion and drawings that accompany the present application. The drawings of the present application, which are referred to herein below in greater detail, are provided for illustrative purposes and, as such, they are not drawn to scale.

Figure 1:
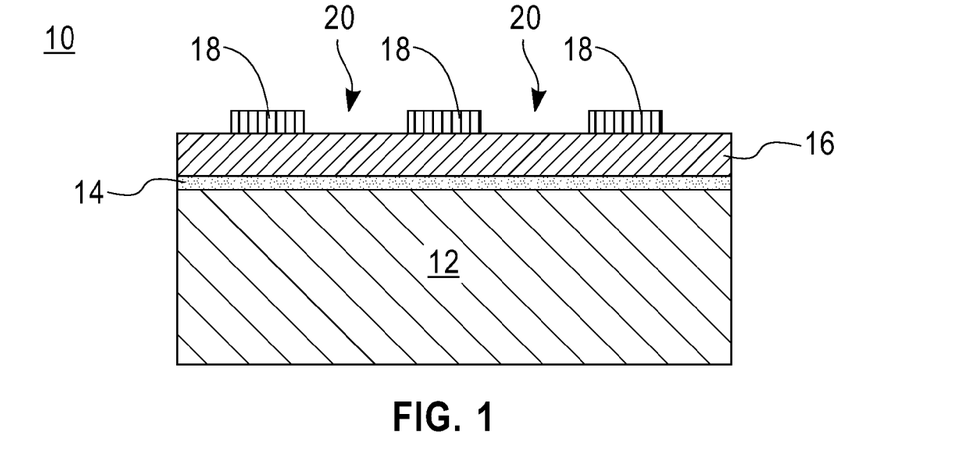
FIG. 1 is a pictorial representation (through a cross sectional view) depicting an initial structure including, from bottom to top, a substrate, a graphene layer, a hard mask and a patterned photoresist that can be employed in one embodiment of the present application.

Reference is first made to FIGS. 1-4 which illustrate the basic processing steps that can be employed in one embodiment of the present disclosure. Specifically, FIG. 1 illustrates an initial structure 10 that can be employed in one embodiment of the present disclosure. The initial structure 10 includes, from bottom to top, a substrate 12, a graphene layer 14 located on an upper surface of the substrate 12, a hard mask 16 located on an upper surface of the graphene layer 14, and a patterned photoresist 18 located on an upper surface of the hard mask 16.

The substrate 12 of the initial structure 10 can be a semiconductor material, a dielectric material, or any combination thereof including a multilayered stack. The term 'semiconductor material' denotes any material that has semiconductor properties. Examples of semiconductor materials that can be employed as the substrate 12 include, but are not limited to, Si, SiGe, SiGeC, SiC, Ge alloys, GaAs, InAs, InP, and other III/V or II/VI compound semiconductors. In addition to these listed types of semiconductor materials, the semiconductor material that can be employed as substrate 12 can also be a layered semiconductor such as, for example, Si/SiGe, Si/SiC, silicon-on-insulators (SOIs) or silicon germanium-on-insulators (SGOIs), and other II/VV or II/VI compound semiconductors. In some embodiments, the substrate 12 can be a Si-containing semiconductor material, i.e., a semiconductor material that includes silicon. The semiconductor material that can be employed as substrate 12 can be single crystalline, polycrystalline, or amorphous. The semiconductor materials that can be employed as substrate 12 can be undoped, doped or contain doped and undoped regions therein. In one embodiment, the semiconductor material is a top layer of a multilayer stack that is employed as substrate 12.

The dielectric material that can be employed as substrate 12 includes any material having insulator properties. Examples of dielectric materials that can be employed as substrate 12 include, but are not limited to, glass, $SiO_2$, SiN, organosilicate glass (OSG, SiCOH, or porous SiCOH), SiC:H, SiCN:H, plastic, diamond-like carbon, boron nitride (BN), carbon boron nitride ($C_xBN$) or a mixture of amorphous/hexagonal bonding boron nitride and carbon boron nitride. In one embodiment, the dielectric material is a top layer of a multilayer stack that is employed as substrate 12.

As is illustrated in FIG. 1, graphene layer 14 is located on an upper surface of substrate 12. The term "graphene" is used herein to denote a one-atom-thick planar sheet of $sp^2$-bonded carbon atoms that are densely packed in a honeycomb crystal lattice. The graphene employed as graphene layer 14 has a two-dimensional (2D) hexagonal crystallographic bonding structure. The graphene that can be employed as graphene layer 14 can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases. The graphene employed as graphene layer 14 can also include, if desired, substitutional, interstitial and/or intercalated dopant species as well.

The graphene layer 14 can be formed utilizing techniques that are well known in the art. For example, the graphene layer 14 can be formed by mechanical exfoliation of graphite, epitaxial growth on silicon carbide, epitaxial growth on metal substrates, hydrazine reduction in which graphene oxide is placed in a solution of pure hydrazine which reduces the graphene oxide into graphene, and sodium reduction of ethanol, i.e., by the reduction of ethanol by sodium metal, followed by pyrolysis of the ethoxide product and washing to remove sodium salts. Another method of forming graphene layer 14 can be from carbon nanotubes. In addition to the aforementioned methods, the graphene layer 14 can be formed onto the substrate 12 utilizing a layer transfer technique.

The thickness of the graphene layer 14 can vary depending on, for example, the technique that was employed in forming the same. In one embodiment, the graphene layer 14 typically has a thickness from 0.34 nm to 10 nm, with a thickness from 0.34 nm to 3.4 nm being more typical. Other thicknesses besides those mentioned above can also be employed.

As is also illustrated in FIG. 1, hard mask 16 is located on an upper surface of the graphene layer 14. The hard mask 16 can be comprised of any material (crystalline or amorphous) that has a very large etch selectivity to graphene. Illustrative examples of such hard mask materials that can be employed as hard mask 16 include a metal such as, for example, aluminum and palladium, silicon, an oxide, a nitride, an oxynitride, and a metal nitride such as, for example, TaSiN. In one embodiment, amorphous hard mask materials such as TaSiN are employed rather than crystalline hard mask materials since an amorphous hard mask material can produce smoother edges when patterned, thus reducing the potential of transferring line edge roughness during the subsequent processing of the graphene layer 14.

The hard mask 16 can be formed utilizing conventional techniques well known to those skilled in the art. For example, the hard mask 16 can be formed utilizing a deposition process including, but not limited to, chemical vapor deposition (CVD), plasma enhanced chemical vapor deposition (PECVD), atomic layer deposition (ALD), chemical solution deposition, plating, and physical vapor deposition (PVD), such as sputtering and evaporation.

The initial structure 10 also includes patterned photoresist 18 located on an upper surface of the hard mask 16. The patterned photoresist 18 has at least one opening 20 which exposes a portion of the underlying hard mask 16. The patterned photoresist 18 is formed utilizing a conventional lithographic process including, for example, deposition of a photoresist material, exposing the photoresist material to a desired pattern of radiation and developing the exposed photoresist material utilizing a conventional resist developer. The photoresist material that can be employed in the present disclosure as the patterned photoresist 18 can include a negative-tone photoresist, a positive-tone photoresist or a hybrid photoresist that includes a combination of positive-tone and negative-tone properties. The photoresist material can be formed atop the hard mask 16 utilizing any conventional deposition process including, for example, spin-on coating, and spray coating.

In some embodiments of the present disclosure, e-beam lithography is used in patterning the photoresist material. E-beam lithography, i.e., electron beam lithography, includes scanning a beam of electrons in a patterned fashion across a surface covered with a photoresist material. One advantage of electron beam lithography is that it is one of the ways to beat the optical diffraction limit and make features in the nanometer regime. By "nanometer regime", it is meant a dimension of less than 100 nm.

Figure 2:
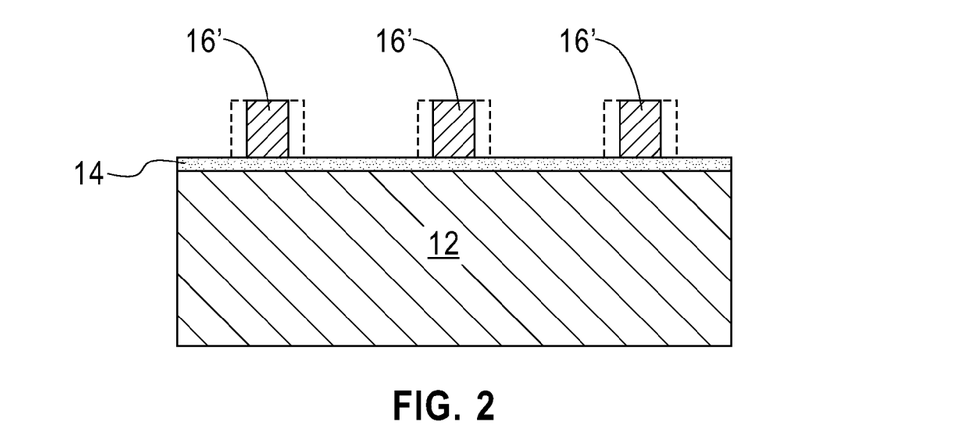
FIG. 2 is a pictorial representation (through a cross sectional view) depicting the initial structure of FIG. 1 after patterning the hard mask into a patterned hard mask, and removing the patterned photoresist from the structure.

Referring now to FIG. 2, there is illustrated the structure of FIG. 1 after patterning the hard mask 16 into a patterned hard mask 16' and removing the patterned photoresist 18 from the structure. As shown, the patterned hard mask 16' protects some portions of the underlying graphene layer 14, while other portions of the graphene layer 14, not including the patterned hard mask 16', are exposed. The patterned hard mask 16' can be formed utilizing dry etching, wet etching or a combination thereof. When dry etching is employed in forming the patterned hard mask 16', one of reactive ion etching, ion beam etching, plasma etching and laser ablation can be used to transfer the pattern from the patterned photoresist 18 into the underlying hard mask 16. When wet etching is employed in forming the patterned hard mask 16', a chemical etchant that selectively removes the hard mask material relative to the patterned photoresist 18 can be used. It is noted that the phantom dotted lines shown in FIG. 2 represent the minimal pitch of the patterned hard mask 16' when it is subject to one of the above mentioned etching techniques. The term "minimal pitch" denotes the minimum sum of the width of one line and one space in the structures of FIG. 2 achievable by the used patterning technique.

In some embodiments of present disclosure, an over etching process can be used to produce hard mask patterns that are narrower than half of the minimal pitch mentioned above. In FIG. 2, patterned hard mask 16' is shown as being over etched. Over etching can be achieved in the present disclosure by prolonging the duration of the etching process in order to thin down the width of the hard mask lines.

After patterning the hard mask 16 into patterned hard mask 16', the patterned photoresist 18 might be removed from atop the structure utilizing a conventional resist stripping process such as, for example, solvent based stripping. It is observed that $O_2$ plasma cannot be employed in this case since it will attack the exposed graphene film. In some embodiments, the patterned photoresist 18 can remain atop the patterned hard mask 16' and be removed later on in the process, i.e., either after providing the structure shown in FIG. 3 or the structure shown in FIG. 4.

Figure 3:
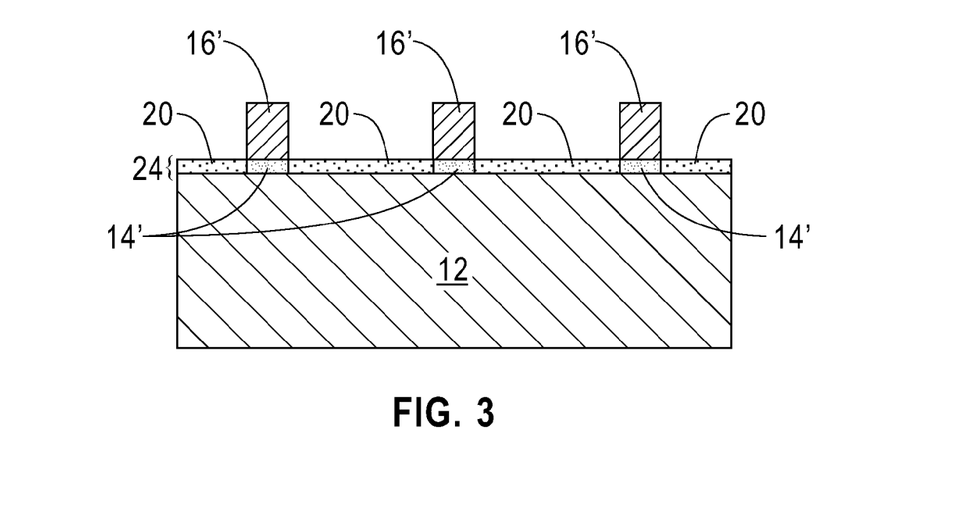
FIG. 3 is a pictorial representation (though a cross sectional view) depicting the structure of FIG. 2 after converting exposed portions of the graphene layer that are not protected by the patterned hard mask into insulating ribbons.

Referring now to FIG. 3, there is depicted the structure of FIG. 2 after converting the exposed portions of the graphene layer 14 that are not protected by the patterned hard mask 16' into insulating ribbons 20. In some embodiments, the insulating ribbons 20 are insulating nanoribbons. The portions of the graphene layer 14 that are protected by the patterned hard mask 16' and are not converting to insulating ribbons 20 are referred to herein as graphene nanoribbons 14'. In one embodiment, the insulating ribbons 20 can be comprised of fully or partially hydrogenated graphene, or graphane. In another embodiment, the insulating ribbons 20 can be comprised of fluorinated graphene, or fluorographene. In the nanoribbon-containing layer 24, the insulating ribbons 20 have insulating properties, while the narrow graphene nanoribbons are semiconductors with high mobilities and thus can serve as device channels.

The insulating ribbons 20 that are formed have a width that is dependent on the spacing between neighboring patterned hard mask 16'. Typically, the insulating ribbons 20 have a width from 1 nm to 1000 nm, with a width from 10 nm to 100 nm being more typical. The graphene nanoribbons 14' that are formed have a width that is dependent on the width of the overlying patterned hard mask 16. Typically, the graphene nanoribbons 14' have a width from 1 nm to 20 nm, with a width from 1 nm to 7 nm being more typical. As shown in FIG. 3, a nanoribbon-containing layer 24 is provided that has alternating graphene nanoribbons 14' separated by alternating insulating ribbons 20. The structure comprising parallel graphene nanoribbons enables the fabrication of FETs comprising several nanoribbons, the number of nanoribbons being determined by the required output current of the device.

The insulating ribbons 20 can formed by exposing the exposed portions of graphene layer 14 to a hydrogen-containing ambient or a fluorine-containing ambient under conditions that are suitable to convert the exposed graphene into an insulating nanoribbon. The hydrogen-containing ambient may include molecular hydrogen or atomic hydrogen. Likewise, the fluorine-containing ambient may include molecular fluorine or atomic fluorine. In embodiments in which the hard mask is composed of a metal such as Pd, the patterned metal hard mask can serve as a catalyst for the decomposition of molecular hydrogen into atomic species.

In one embodiment, a thermal process can be used to form the insulating ribbons 20. In another embodiment, a plasma process can be used in forming the insulating ribbons 20.

In the embodiment in which a thermal process is employed, the exposed portions of the graphene layer 14 that are not protected by the patterned hard mask 16' are subjected to a heat treatment in a hydrogen-containing ambient or a fluorine-containing ambient. The heat treatment may be performed in a single step or multiple heat treatment steps can be employed. A heating regime including various ramp and soak cycles can be employed in the present disclosure.

The hydrogen-containing ambient that can be employed in the thermal process includes an atmosphere that contains molecular hydrogen. The fluorine-containing ambient that can be employed in the thermal process includes an atmosphere that contains a fluorine-containing precursor such as, for example, molecular fluorine or xenon fluoride ($XeF_2$).

In the embodiment in which a plasma process is employed, the exposed portions of the graphene layer 14 that are not protected by the patterned hard mask 16' are subjected to atomic hydrogen or atomic fluorine produced by dissociation of molecular hydrogen or molecular fluorine in a plasma. In one embodiment, the dissociation is performed in a remote plasma to prevent plasma damage to the modified layers. Any plasma generating apparatus can be employed in the present disclosure.

Figure 4:
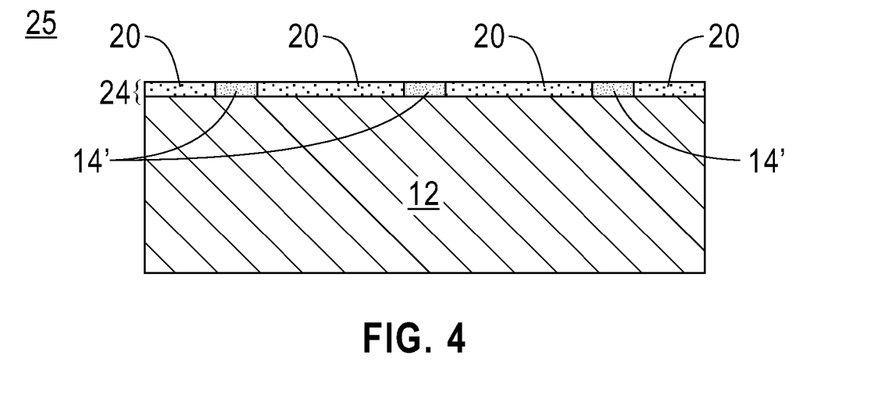
FIG. 4 is a pictorial representation (through a cross sectional view) depicting the structure of FIG. 3 after removing the patterned hard mask to provide a structure including a nanoribbon-containing layer of alternating graphene nanoribbons separated by alternating insulating ribbons.

Referring to FIG. 4, there is illustrated the structure of FIG. 3 after removing the patterned hard mask 16' to provide a structure 25 including the nanoribbon-containing layer 24 of alternating graphene nanoribbons 14' separated by alternating insulating ribbons 20. In one embodiment, the patterned hard mask 16' can be removed from the structure utilizing an etching process that selectively removes the material of the patterned hard mask 16' relative to the underlying nanoribbon-containing layer 24. In another embodiment, the patterned hard mask 16' can be removed from the structure utilizing a planarization process such as, for example, chemical mechanical planarization.

Reference is now made to FIGS. 5-9 which illustrate a second embodiment of the present application that can be used to form a structure including a nanoribbon-containing layer of alternating graphene nanoribbons separated by alternating insulating ribbons atop a substrate. This embodiment of the present disclosure includes first providing the structure shown in FIG. 2 of the first embodiment of the present disclosure.

Next, a conformal material layer 30 is formed on exposed surfaces of the structure including atop the exposed surfaces of the graphene layer 14 as well as on sidewalls and atop the patterned hard mask 16'. The structure including the conformal material layer 30 is shown, for example, in FIG. 5.

Figure 5:
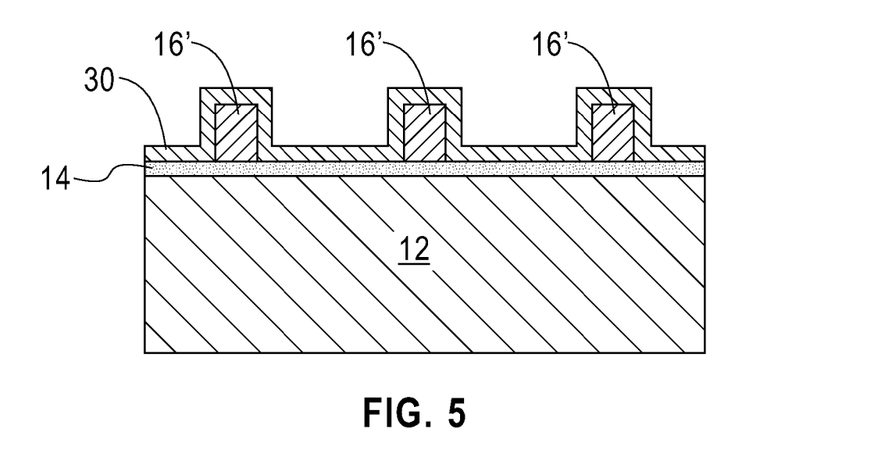
FIG. 5 is a pictorial representation (through a cross sectional view) depicting the structure of FIG. 2 after forming a conformal material layer on exposed surfaces of the structure including atop the exposed surfaces of the graphene layer as well as on sidewalls and atop the patterned hard mask.

The conformal material layer 30 is a thin layer whose thickness is typically from 1 nm to 50 nm, with a thickness from 3 nm to 15 nm being more typical. The conformal material layer 30 includes a different material than the material used in forming the hard mask. In one embodiment, the conformal material layer 30 can comprise an oxide such as, for example, $Al_2O_3$, $TiO_2$, $SnO_2$, ZnO and $HfO_2$. In another embodiment, the conformal material layer 30 can be comprised of a metal nitride such as, for example, TiN, TaN, WN and NbN. In a further embodiment, the conformal material layer 30 can be comprised of a metal such as, for example, Ru, Pd, Ir and Pt. In an even further embodiment, the conformal material layer 30 can be comprised of a metal sulfide such as, for example, ZnS. In yet another embodiment, the conformal material layer 30 includes a multilayered stack of such materials. It is again emphasized that the material of the conformal material layer 30 must be different from the material of the hard mask so as to permit subsequent selective removal of the patterned hard mask 16' from the structure.

The conformal material layer 30 can be formed utilizing any conformal deposition process including, for example, chemical vapor deposition (CVD), atomic layer deposition (ALD), or PVD techniques. In one embodiment, ALD is employed as a preferred technique in forming the conformal material layer 30.

Figure 6A:
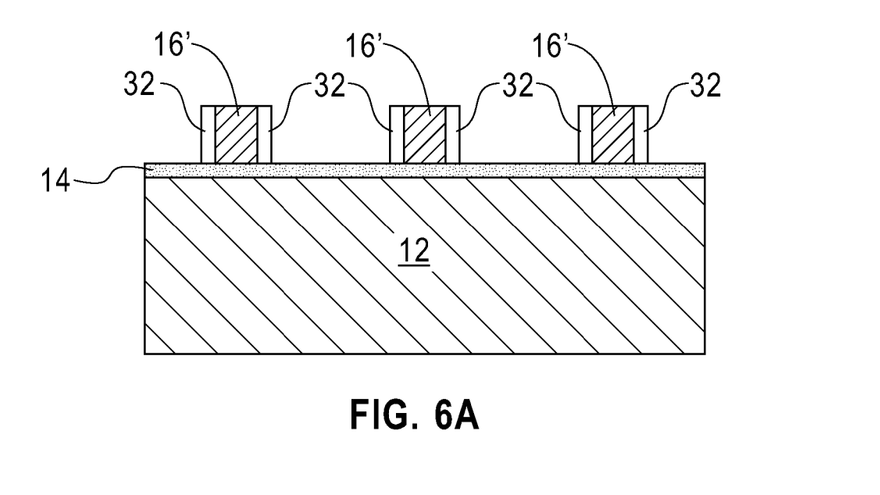
FIG. 6A is a pictorial representation (through a cross sectional view) depicting the structure of FIG. 5 after performing a selective directional etching step which converts the conformal material layer into spacers without etching the graphene layer.
Figure 6B:
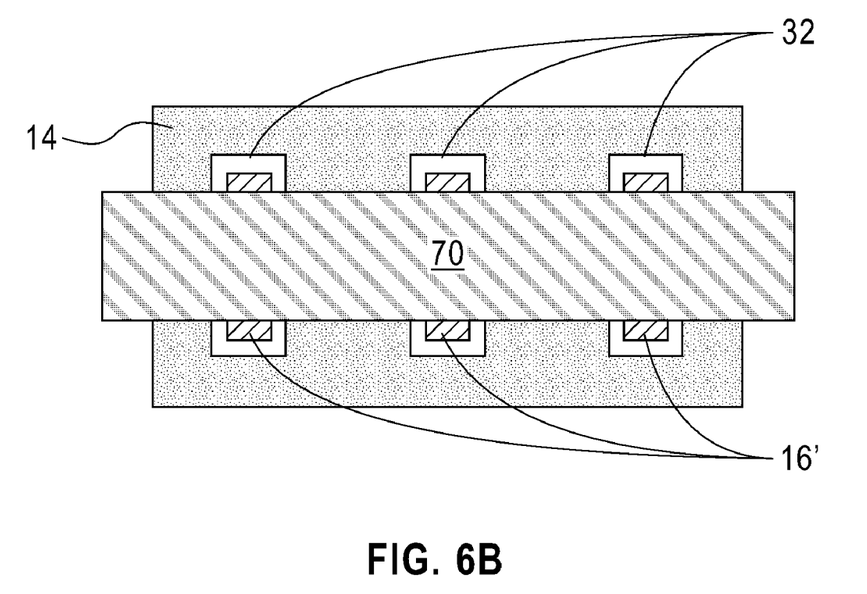
FIG. 6B is a top down view of FIG. 6A including an additional mask used to trim the spacer 32 at each ends of the patterned hard mask.

Referring now to FIG. 6A, there is depicted the structure of FIG. 5 after performing a directional etching step which converts the conformal material layer 30 into spacers 32. As shown in FIG. 6A, the spacers 32 have the shape of fences and the spacers 32 are located on the vertical sidewalls of the patterned hard mask 16'. The directional etching step employed selectively removes portions of the conformal material layer 30 from all horizontal surfaces of the structure. When isolated ribbons are needed, an additional mask 70 is typically required to remove spacer 32 at each ends of the patterned hard mask 16'. This additional mask 70 used to trim the spacer 32 is illustrated in FIG. 6B. FIG. 6B is a top down view of the structure shown in FIG. 6A including the additional mask 70 thereon. Alternatively, it is possible to pattern the graphene layer prior to the formation of the patterned hard mask 16' and have the patterned hard mask 16' extend beyond the edge of the patterned graphene film.

Figure 7:
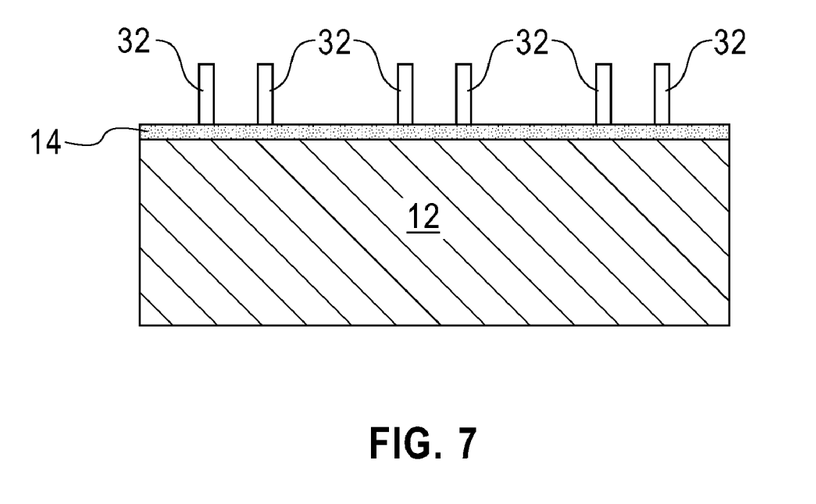
FIG. 7 is a pictorial representation (through a cross sectional view) depicting the structure of FIG. 6A after removing the patterned hard mask from the structure.

Referring to FIG. 7, there is depicted the structure of FIG. 6A after removing the patterned hard mask 16' from the structure. The patterned hard mask 16' is removed from the structure utilizing an etching process that is selective in removing the material of the patterned hard mask 16' relative to the material of spacers 32. In one embodiment, the etch can include wet etching. When a wet etching process is used, a chemical etchant such as, for example, buffered HF solution can be employed. As shown in FIG. 6A, the spacers 32 remain atop the graphene layer 14. The spacers 32 protect portions of the underlying graphene layer 14, while other portions of the graphene layer 14, not including the spacers 32, are exposed. It is noted that this embodiment of the present disclosure permits for forming narrower width graphene nanoribbons. In some embodiments, the graphene nanoribbons to be subsequently formed can have a width as thin as 1 nm to 2 nm.

Figure 8:
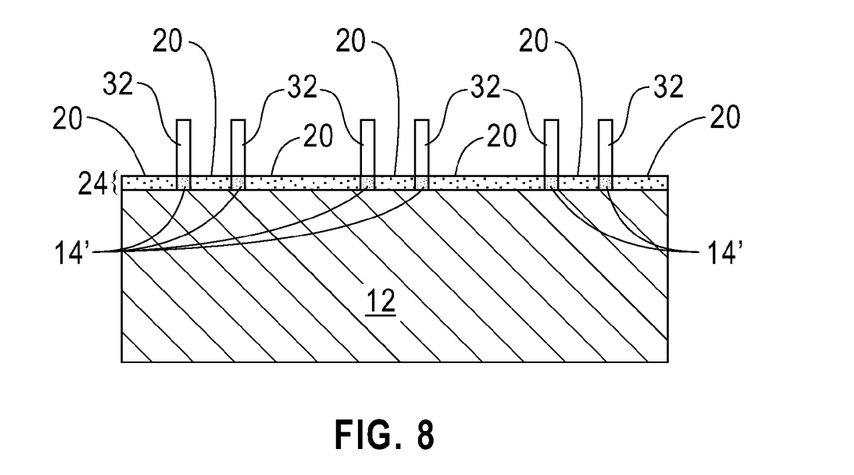
FIG. 8 is a pictorial representation (through a cross sectional view) depicting the structure of FIG. 7 after converting the exposed portions of the graphene layer that are not protected by the spacers into insulating ribbons.

Referring to FIG. 8, there is depicted the structure of FIG. 7 after converting the exposed portions of the graphene layer 14 that are not protected by the spacers 32 into insulating ribbons 20; the portions of the graphene layer underneath the spacers 32 are the graphene nanoribbons 14'. Reference numeral 24 denotes the nanoribbon-containing layer. The insulating ribbons 20 of this embodiment can be formed utilizing one of the techniques mentioned above for forming the insulating ribbons in the first embodiment of the present disclosure.

Figure 9:
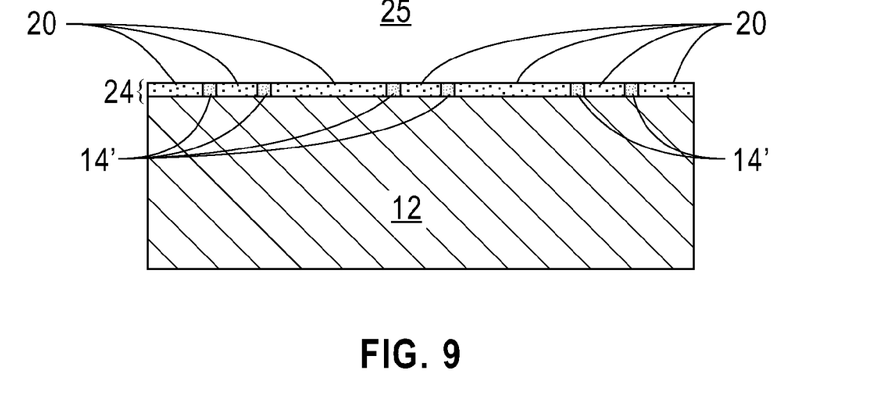
FIG. 9 is a pictorial presentation (through a cross sectional view) illustrating the structure of FIG. 8 after removing the spacers to provide a structure including a nanoribbon-containing layer of alternating graphene nanoribbons separated by alternating insulating ribbons.

Referring now to FIG. 9, there is illustrated the structure of FIG. 8 after removing the spacers 32 to provide a structure 25 including the nanoribbon-containing layer 24 of alternating graphene nanoribbons 14' separated by alternating insulating ribbons 20. The spacers 32 can be removed utilizing an etching process that selectively removes the material of spacers 32 relative to the nanoribbon-containing layer 24. In another embodiment, the removal of spacers 32 can be performed utilizing a planarization process such as, for example, chemical mechanical planarization.

Figure 10:
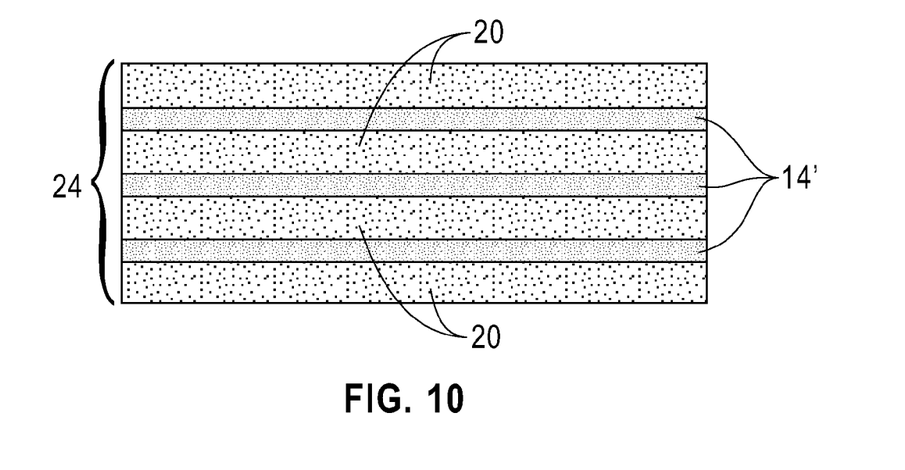
FIG. 10 is a pictorial representation (through a top down view) illustrating the structure shown in either FIG. 4 or FIG. 9.

Reference is now made to FIG. 10 which is an illustration of the structure 25 shown in FIG. 4 through a top down view. FIG. 10 can also be used to represent the structure 25 shown in FIG. 9. As shown, the structure 25 includes a nanoribbon-containing layer 24 that has alternating nanoribbons of graphene (i.e., graphene nanoribbons 14') and alternating layers of insulating material (i.e., insulating ribbons 20). The alternating graphene nanoribbons 14' are parallel to a surface of the underlying substrate 10 and they might be oriented along crystallographic directions of the substrate 10. As mentioned above, the alternating insulating ribbons 20 may comprise fully or partially hydrogenated graphene, i.e., graphane, fluorinated graphene, or fluorographene.

Figure 11A:
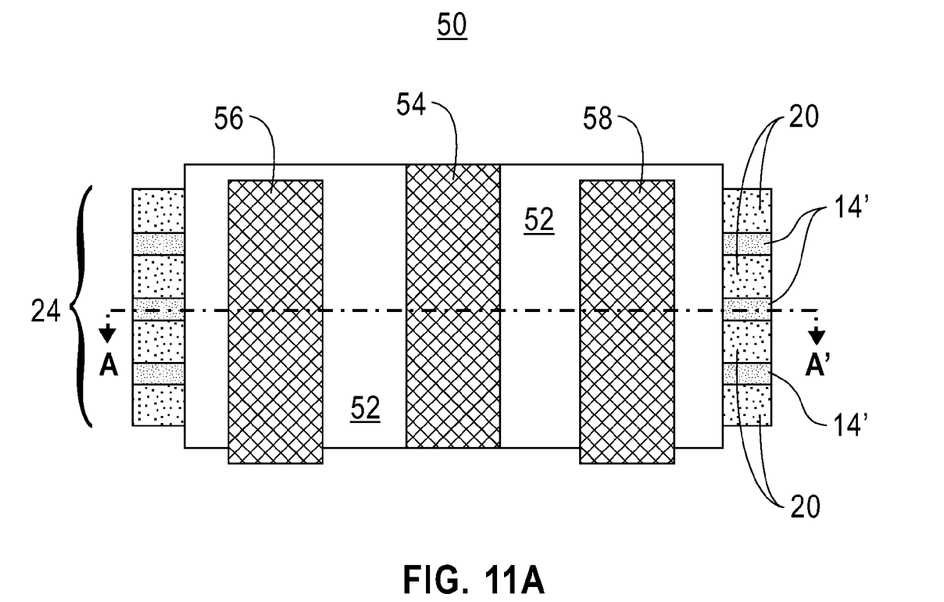
FIGS. 11A and 11B are pictorial representations (through a top down view and a cross sectional view, respectively) of a semiconductor device that includes the structure shown in either FIG. 4 or FIG. 9.
Figure 11B:
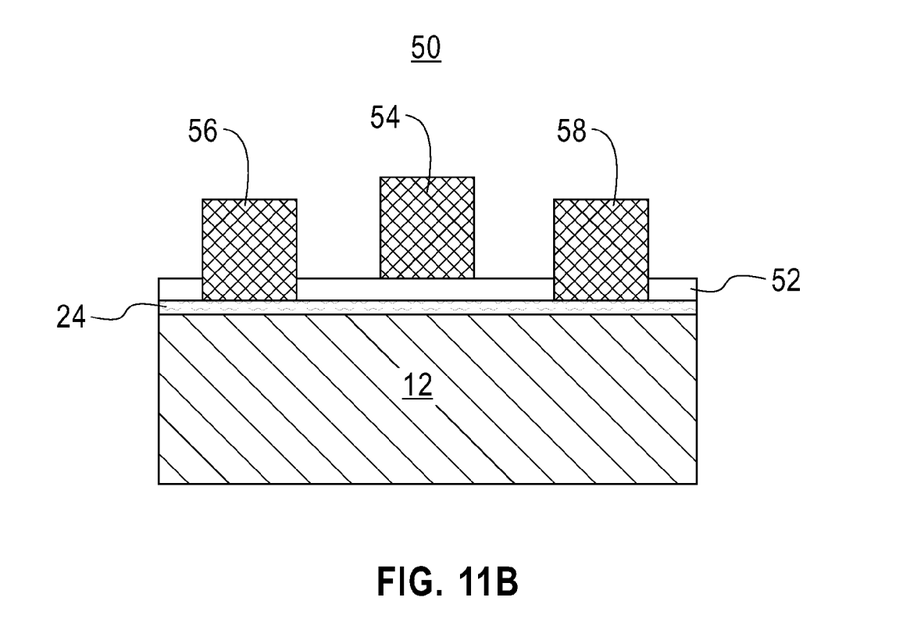

Reference is now made to FIGS. 11A and 11B which are pictorial representations through a top down view and a cross sectional view, respectively, of a semiconductor device 50 of the present disclosure that includes the structure 25 shown either FIG. 4 or FIG. 9. It is observed that the cross sectional view is through cut A-A' shown in the top down view. As shown, the semiconductor device 50 includes substrate 10, nanoribbon-containing layer 24 including alternating graphene nanoribbons 14' separated by alternating insulating ribbons 20, a gate dielectric layer 52 located on an upper surface of the nanoribbon-containing layer 24, a gate conductor 54 located on a portion of the gate dielectric layer 52, and a source region 56 and a drain region 58 located on an upper surface of the nanoribbon-containing layer 24 and on opposite sides of the gate conductor 54. The source region 56 and the drain region 58 extend through the gate dielectric layer 52 contacting an upper surface of the nanoribbon-containing layer 24.

The semiconductor device 50 shown in FIGS. 11A and 11B is formed by first providing the structure 25 shown in either FIG. 4 or FIG. 9. Next, gate dielectric layer 52 is formed on an upper surface of the nanoribbon-containing layer 24. The gate dielectric layer 52 employed can include any insulating material such as for example, an organic polymer, an oxide, a nitride, an oxynitride or a multilayered stack thereof. In one embodiment, the gate dielectric layer 52 can include a semiconductor oxide, a semiconductor nitride or a semiconductor oxynitride. In another embodiment, the gate dielectric layer 52 can include a dielectric metal oxide or mixed metal oxide having a dielectric constant that is greater than the dielectric constant of silicon oxide, i.e., 3.9. Typically, the dielectric material that can be employed as the gate dielectric layer 52 has a dielectric constant greater than 4.0, with a dielectric constant of greater than 8.0 being more typical. Such dielectric materials are referred to herein as high k dielectrics. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $U_2O_xN_y$, $SiON$, $SiN_x$, a silicate thereof, and an alloy thereof. Multilayered stacks of these high k materials can also be employed as the gate dielectric layer 52. Each value of x is independently from 0.5 to 3 and each value of y is independently from 0 to 2.

The thickness of the gate dielectric layer 52 that can be employed may vary depending on the technique used to form the same. Typically, the gate dielectric layer 52 that can be employed has a thickness from 1 nm to 20 nm, with a thickness from 2 nm to 10 nm being more typical.

The gate dielectric layer 52 can be formed by methods well known in the art. In one embodiment, the gate dielectric layer 52 can be formed by a deposition process such as, for example, chemical vapor deposition (CVD), plasma enhanced chemical vapor deposition (PECVD), physical vapor deposition (PVD), molecular beam deposition (MBD), pulsed laser deposition (PLD), liquid source misted chemical deposition (LSMCD), and atomic layer deposition (ALD). If the gate dielectric is a stack of several layers, some of the layers can be deposited by chemical solution deposition or spin-on technique.

After forming the gate dielectric layer 52, the gate conductor 54 can be formed. The gate conductor 54 includes any conductive material including, but not limited to, polycrystalline silicon, polycrystalline silicon germanium, an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the conductive material that can be employed as gate conductor 54 can be comprised of an nFET metal gate. In another embodiment, the conductive material that can be employed as gate conductor 54 can be comprised of a pFET metal gate. In a further embodiment, the conductive material that can be employed as gate conductor 54 can be comprised of polycrystalline silicon. The polysilicon conductive material can be used alone, or in conjunction with another conductive material such as, for example, a metal conductive material and/or a metal silicide material.

The conductive material that is employed as gate conductor 54 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When Si-containing materials are used as the conductive material, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed. The as-deposited conductive material typically has a thickness from 1 nm to 100 nm, with a thickness from 3 nm to 30 nm being even more typical.

Following deposition of the conductive material, the conductive material is patterned by lithography into the gate conductor 54.

The semiconductor device 50 further includes source region 56 and drain region 58 that make electrical contact to portions of the nanoribbon-containing layer 24. The source region 56 and the drain region 58 include one of the conductive materials mentioned above for gate conductor 54. The source region 56 and the drain region 58 can be formed by etching an opening in the gate dielectric layer 52, deposition, lithography and etching.

Figure 12A:
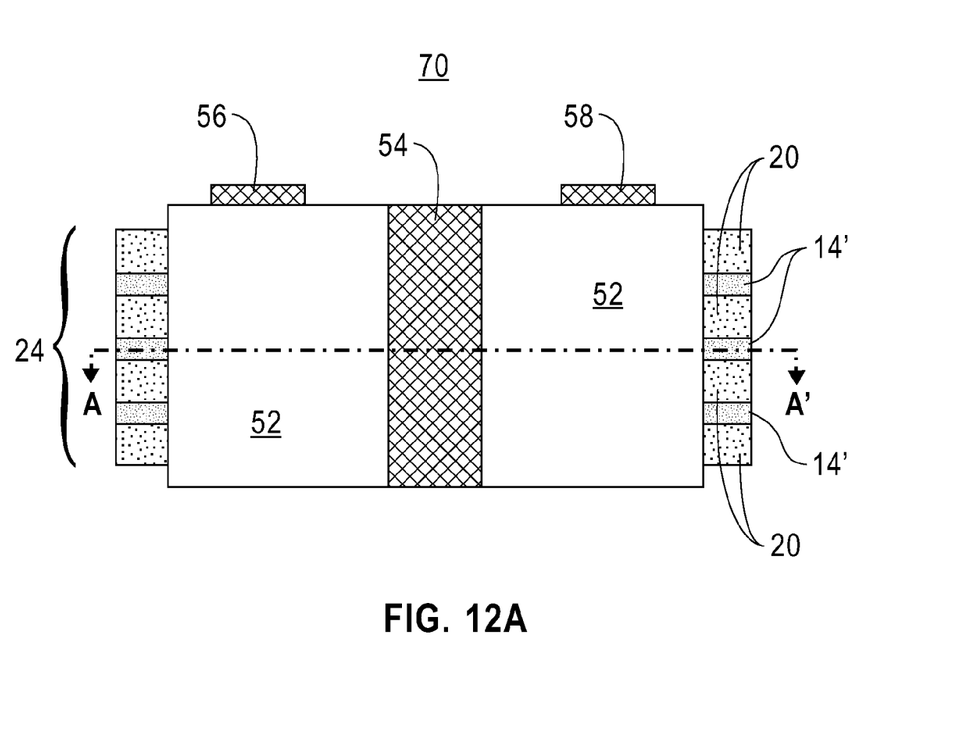
FIGS. 12A and 12B are pictorial representations (through a top down view and a cross sectional view, respectively) of another semiconductor device that includes the structure shown in either FIG. 4 or FIG. 9.
Figure 12B:
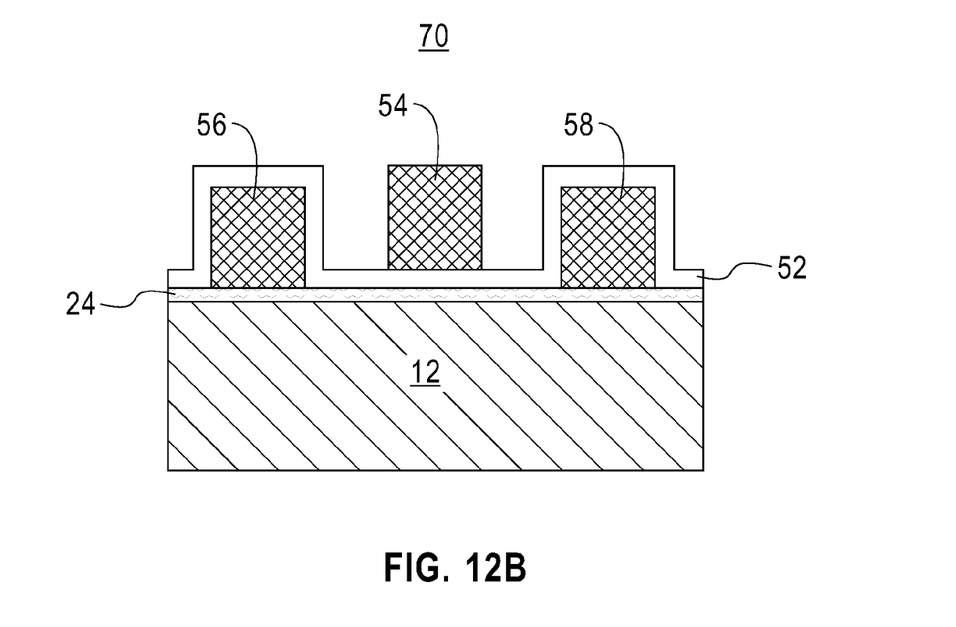

Reference is now made to FIGS. 12A and 12B which are a top down view and a cross sectional view, respectively of another semiconductor device 70 that includes the structure 25 shown in either FIG. 4 or FIG. 9. It is observed that the cross sectional view is through cut A-A' shown in the top down view. The another semiconductor device 70 includes substrate 10, nanoribbon-containing layer 24 including alternating graphene nanoribbons 14' separated by alternating insulating ribbons 20, a gate dielectric layer 52, a gate conductor 54 located on a portion of the gate dielectric layer 52, and a source region 56 and a drain region 58 located on an upper surface of the nanoribbon-containing layer 24 and on opposite sides of the gate conductor 54. In this embodiment, a portion of the gate dielectric 52 is located on sidewalls and atop the source region 56 and the drain region 58. The elements of semiconductor device 70, which have like reference numerals as the elements of the semiconductor device 50, include the materials mentioned above. Semiconductor device 70 can be formed similar to the semiconductor device 50 mentioned above except that the source region 56 and drain region 58 are formed prior to forming the gate dielectric layer 52 and the gate conductor 54. In this embodiment, a conventional lift off process can be employed in forming the source region 56 and the drain region 58. Alternatively, the source region 56 and the drain region 58 can be formed by deposition, lithography and etching.

It is noted that the number of alternating graphene nanoribbons and alternating insulating ribbons within the nanoribbon-containing layer of this disclosure may vary and is dependent on the types and number of semiconductor devices that are being fabricating thereon. In one embodiment, the nanoribbon-containing layer can have a single graphene nanoribbon and insulating ribbons located on opposite sides of the single graphene nanoribbon.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
a substrate; and
a single nanoribbon-containing layer located on an upper surface of the substrate, wherein the single nanoribbon-containing layer includes alternating graphene nanoribbons that are separated by alternating insulating ribbons, wherein the graphene nanoribbons and the insulating ribbons are coplanar.

2. The semiconductor structure of claim 1 wherein said substrate is a dielectric material, and said dielectric material is selected from the group consisting of glass, $SiO_2$, SiN, organosilicate glass, SC:H, SiCN:H, plastic, diamond-like carbon, boron nitride (BN), carbon boron nitride ($C_xBN$) and a mixture of amorphous/hexagonal bonding boron nitride and carbon boron nitride.

3. The semiconductor structure of claim 2 wherein dielectric material is a top layer of a multilayer stack.

4. The semiconductor structure of claim 1 wherein said substrate is a semiconductor material, and said semiconductor material is selected from the group consisting of Si, SiGe, SiGeC, SiC, Ge alloys, GaAs, InAs, and InP.

5. The semiconductor structure of claim 4 wherein semiconductor material is a top layer of a multilayer stack.

6. The semiconductor structure of claim 1 wherein each of said alternating graphene nanoribbons has a width from 1 nm to 20 nm.

7. The semiconductor structure of claim 1 wherein each of said alternating graphene nanoribbons has a width from 1 nm to 2 nm.

8. The semiconductor structure of claim 1 wherein each of said alternating graphene nanoribbons has a hexagonal crystallographic bonding structure.

9. The semiconductor structure of claim 1 wherein each of said alternating graphene nanoribbons is comprised of single-layer graphene, few-layer graphene, multi-layer graphene, a mixture of single-layer, few-layer, and multi-layer graphene.

10. The semiconductor structure of claim 1 wherein each of said alternating insulating ribbons is comprised of fully or partially hydrogenated graphene.

11. The semiconductor structure of claim 1 wherein each of said alternating insulating ribbons is comprised of fluorinated graphene or fluorographene.

12. A method of fabricating a semiconductor structure comprising:
providing a single graphene layer on an upper surface of a substrate; and
converting alternating portions of the single graphene layer into insulating ribbons, while remaining alternating portions of the single graphene layer form graphene nanoribbons, wherein the graphene nanoribbons and the insulating ribbons are coplanar.

13. The method of claim 12 wherein said providing the graphene layer includes mechanical exfoliation of graphite; epitaxial growth; hydrazine reduction in which a graphene oxide paper is placed in a solution of pure hydrazine which reduces the graphene oxide paper into single-layered graphene; sodium reduction of ethanol to form an ethoxide product, pyrolyzing the ethoxide product and washing to remove sodium salts; formation of carbon nanotubes, or a layer transfer technique.

14. The method of claim 12 further comprising forming a patterned hard mask on an upper surface of the graphene layer prior to said converting, wherein other portions of said graphene layer not protected by said patterned hard mask are converted into said insulating ribbons, and wherein portions of said graphene layer that are protected by said patterned hard mask form said graphene nanoribbons.

15. The method of claim 12 further comprising forming spacers on an upper surface of said graphene layer prior to converting, wherein portions of said graphene layer not protected by said spacers are converted into said insulating ribbons, and wherein other portions of said graphene layer that are protected by said spacer form said graphene nanoribbons.

16. The method of claim 15 wherein said forming said spacers includes forming a patterned hard mask on the surface of said graphene layer, depositing a conformal material layer on exposed surfaces of said graphene layer and on sidewalls and atop said patterned hard mask, etching said conformal material layer into said spacers, and removing the patterned hard mask selective to said spacers.

17. The method of claim 12 wherein said converting includes exposing alternating portions of the graphene layer to a hydrogen-containing ambient or a fluorine-containing ambient.

18. The method of claim 17 wherein said hydrogen-containing ambient includes molecular or atomic hydrogen.

19. The method of claim 17 wherein said fluorine-containing ambient includes molecular or atomic fluorine.

20. A structure comprising:
at least one semiconductor device located atop a substrate, wherein the at least one semiconductor devices includes at least one graphene nanoribbon as a device element, and the at least one graphene nanoribbon is a component of a single nanoribbon-containing layer comprising alternating graphene nanoribbons separated by alternating insulating ribbons, wherein the graphene nanoribbons and the insulating ribbons are coplanar.

21. An integrated circuit containing at least the structure of claim 20.

* * * * *